US012116502B2

(12) United States Patent
Chang et al.

(10) Patent No.: US 12,116,502 B2
(45) Date of Patent: Oct. 15, 2024

(54) SELF-STOPPING POLISHING COMPOSITION AND METHOD FOR HIGH TOPOLOGICAL SELECTIVITY

(71) Applicant: CMC Materials, Inc., Aurora, IL (US)

(72) Inventors: Juyeon Chang, Bolingbrook, IL (US); Sudeep Pallikkara Kuttiatoor, Naperville, IL (US); Sajo Naik, Naperville, IL (US); Elliot Knapton, Aurora, IL (US); Jinfeng Wang, Naperville, IL (US); Michael Willhoff, Naperville, IL (US)

(73) Assignee: CMC Materials LLC, Aurora, IL (US)

( * ) Notice: Subject to any disclaimer, the term of this patent is extended or adjusted under 35 U.S.C. 154(b) by 36 days.

(21) Appl. No.: 17/557,412

(22) Filed: Dec. 21, 2021

(65) Prior Publication Data

US 2022/0195244 A1   Jun. 23, 2022

Related U.S. Application Data

(60) Provisional application No. 63/128,445, filed on Dec. 21, 2020.

(51) Int. Cl.
*C09G 1/02* (2006.01)
*H01L 21/3105* (2006.01)
*H01L 21/321* (2006.01)

(52) U.S. Cl.
CPC .......... *C09G 1/02* (2013.01); *H01L 21/31053* (2013.01); *H01L 21/3212* (2013.01)

(58) Field of Classification Search
CPC .. C09G 1/02; H01L 21/31053; H01L 21/3212
See application file for complete search history.

(56) References Cited

U.S. PATENT DOCUMENTS

| | | | | |
|---|---|---|---|---|
| 10,619,075 | B2 * | 4/2020 | Hains | H01L 21/762 |
| 10,920,107 | B2 * | 2/2021 | Hains | H01L 21/31053 |
| 2008/0121839 | A1 | 5/2008 | Park et al. | |
| 2012/0264304 | A1 * | 10/2012 | Ward | C09G 1/02 438/693 |
| 2017/0066944 | A1 * | 3/2017 | Cui | C09K 3/1463 |
| 2019/0185716 | A1 | 6/2019 | Hains et al. | |
| 2020/0190361 | A1 | 6/2020 | Hains et al. | |
| 2022/0064488 | A1 | 3/2022 | Choi et al. | |

FOREIGN PATENT DOCUMENTS

| | | |
|---|---|---|
| JP | 2024500162 A | 1/2024 |
| KR | 101524624 A | 5/2015 |
| KR | 20200077730 A | 7/2020 |
| WO | 2006115393 A1 | 11/2006 |
| WO | 2018194792 A1 | 10/2018 |

OTHER PUBLICATIONS

Taiwan Intellectual Property Office, Search Report issued in connection with Taiwan Application No. 110147981 on Jun. 26, 2022.
Korean Intellectual Property Office as ISA, International Search Report and Written Opinion of the International Searching Authority issued in connection with Application No. PCT/US2021/064532 on Jun. 2, 2022.

\* cited by examiner

*Primary Examiner* — Alexandra M Moore

(57) ABSTRACT

The invention provides a chemical-mechanical polishing composition comprising: (a) an abrasive selected from a ceria abrasive, a zirconia abrasive, and a combination thereof; (b) a self-stopping agent selected from a compound of formula (I), (c) optionally a nonionic polymer; (d) a cationic monomer compound; and (e) water, wherein the polishing composition has a pH of about 5.5 to about 8. The invention also provides a method of chemically-mechanically polishing a substrate, especially a substrate comprising silicon oxide and optionally polysilicon, using said composition.

25 Claims, No Drawings

SELF-STOPPING POLISHING COMPOSITION AND METHOD FOR HIGH TOPOLOGICAL SELECTIVITY

BACKGROUND OF THE INVENTION

In the fabrication of integrated circuits and other electronic devices, multiple layers of conducting, semiconducting, and dielectric materials are deposited onto or removed from a substrate surface. As layers of materials are sequentially deposited onto and removed from the substrate, the uppermost surface of the substrate may become non-planar and require planarization. Planarizing a surface, or "polishing" a surface, is a process where material is removed from the surface of the substrate to form a generally even, planar surface. Planarization is useful in removing undesired surface topography and surface defects, such as rough surfaces, agglomerated materials, crystal lattice damage, scratches, and contaminated layers or materials. Planarization also is useful in forming features on a substrate by removing excess deposited material used to fill the features and to provide an even surface for subsequent levels of metallization and processing.

Compositions and methods for planarizing or polishing the surface of a substrate are well known in the art. Chemical-mechanical planarization, or chemical-mechanical polishing (CMP), is a common technique used to planarize substrates. CMP utilizes a chemical composition, known as a CMP composition or more simply as a polishing composition (also referred to as a polishing slurry), for selective removal of material from the substrate. Polishing compositions typically are applied to a substrate by contacting the surface of the substrate with a polishing pad (e.g., polishing cloth or polishing disk) saturated with the polishing composition. The polishing of the substrate typically is further aided by the chemical activity of the polishing composition and/or the mechanical activity of an abrasive suspended in the polishing composition or incorporated into the polishing pad (e.g., fixed abrasive polishing pad).

As the size of integrated circuits is reduced and the number of integrated circuits on a chip increases, the components that make up the circuits must be positioned closer together in order to comply with the limited space available on a typical chip. Effective isolation between circuits is important for ensuring optimum semiconductor performance. To that end, shallow trenches are etched into the semiconductor substrate and filled with insulating material to isolate active regions of the integrated circuit. More specifically, shallow trench isolation (STI) is a process in which a silicon nitride layer is formed on a silicon substrate, shallow trenches are formed via etching or photolithography, and a dielectric layer is deposited to fill the trenches. Due to variation in the depth of trenches formed in this manner, it is typically necessary to deposit an excess of dielectric material on top of the substrate to ensure complete filling of all trenches. The dielectric material (e.g., a silicon oxide) conforms to the underlying topography of the substrate.

Thus, after the dielectric material has been placed, the surface of the deposited dielectric material is characterized by an uneven combination of raised areas of the dielectric material separated by trenches in the dielectric material, the raised areas and trenches of the dielectric material aligning with corresponding raised areas and trenches of the underlying surface. The region of the substrate surface that includes the raised dielectric material and trenches is referred to as a pattern field of the substrate, e.g., as "pattern material," "pattern oxide," or "pattern dielectric." The pattern field is characterized by a "step height," which is the difference in height of the raised areas of the dielectric material relative to the trench height.

The excess dielectric material is typically removed by a CMP process, which additionally provides a planar surface for further processing. During removal of the raised area material, an amount of material from the trenches also will be removed. This removal of material from the trenches is referred to as "trench erosion" or "trench loss." Trench loss is the amount (thickness, e.g., in Angstroms (Å)) of material removed from trenches in achieving planarization of pattern dielectric material by eliminating an initial step height. Trench loss is calculated as the initial trench thickness minus a final trench thickness. Desirably, the rate of removal of material from trenches is well below the rate of removal from raised areas. Thus, as material of the raised areas is removed (at a faster rate compared to material being removed from the trenches) the pattern dielectric becomes a highly planarized surface that may be referred to as a "blanket" region of the processed substrate surface, e.g., "blanket dielectric" or "blanket oxide."

A polishing composition can be characterized according to its polishing rate (i.e., removal rate) and its planarization efficiency. The polishing rate refers to the rate of removal of a material from the surface of the substrate and is usually expressed in terms of units of length (thickness, e.g., in Angstroms (Å)) per unit of time (e.g., per minute). Different removal rates relating to different regions of a substrate, or to different stages of a polishing step, can be important in assessing process performance. A "pattern removal rate" or "active removal rate" is the rate of removal of dielectric material from raised areas of pattern dielectric layer at a stage of a process during which a substrate exhibits a substantial step height. "Blanket removal rate" refers to a rate of removal of dielectric material from planarized (i.e., "blanket") areas of a pattern dielectric layer at an end of a polishing step, when step height has been significantly (e.g., essentially entirely) reduced. Planarization efficiency relates to step height reduction versus amount of material removed from the substrate (i.e., step height reduction divided by trench loss). Specifically, a polishing surface, e.g., a polishing pad, first contacts the "high points" of the surface and must remove material in order to form a planar surface. A process that results in achieving a planar surface with less removal of material is considered to be more efficient than a process requiring removal of more material to achieve planarity.

Often the rate of removal of the silicon oxide pattern material can be rate-limiting for the dielectric polishing step in STI processes, and therefore high removal rates of the silicon oxide pattern are desired to increase device throughput. However, if the blanket removal rate is too rapid, overpolishing of oxide in exposed trenches results in trench erosion and increased device defectivity. Overpolishing and associated trench loss can be avoided if the blanket removal rate is lowered.

It is desirable in certain polishing applications for a CMP composition to exhibit "self-stopping" behavior such that when a large percentage of the "high points" of the surface (i.e., raised areas) have been removed, the removal rate decreases. In self-stopping polishing applications, the removal rate is effectively high while a significant step height is present at the substrate surface and then the removal rate is lowered as the surface becomes effectively planar. In various dielectric polishing steps (e.g., of an STI process) the rate of removal of pattern dielectric material (e.g., dielectric layer) is typically a rate-limiting factor of the overall process. Therefore, high removal rates of pattern dielectric material are desired to increase throughput. Good efficiency in the form of relatively low trench loss is also desirable. Further, if the removal rate of dielectric remains high after achieving planarization, overpolishing occurs, resulting in added trench loss.

Thus, a need remains for self-stopping CMP compositions and methods for chemical-mechanical polishing that can exhibit "self-stopping" behavior such that when a large percentage of the "high points" of the surface (i.e., raised areas) have been removed, the removal rate decreases, and can remain stable when exposed to the polishing conditions.

The invention provides such polishing compositions and methods. These and other advantages of the invention, as well as additional inventive features, will be apparent from the description of the invention provided herein.

BRIEF SUMMARY OF THE INVENTION

The invention provides a chemical-mechanical polishing composition comprising, consisting essentially of, or consisting of: (a) an abrasive selected from a ceria abrasive, a zirconia abrasive, and a combination thereof; (b) a self-stopping agent selected from a compound of formula (I):

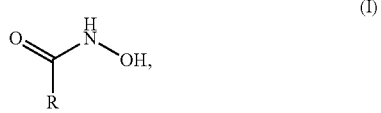

wherein R is selected from the group consisting of hydrogen, alkyl, cycloalkyl, aryl, heterocyclic alkyl, and heterocyclic aryl, each of which may be substituted or unsubstituted; (c) a cationic monomer compound; and (d) water, wherein the polishing composition has a pH of about 5.5 to about 8.

The invention further provides a method of chemically-mechanically polishing a substrate comprising: (i) providing a substrate, (ii) providing a polishing pad, (iii) providing a chemical-mechanical polishing composition comprising: (a) an abrasive selected from a ceria abrasive, a zirconia abrasive, and a combination thereof; (b) a self-stopping agent selected from a compound of formula (I):

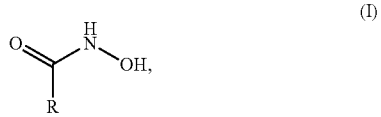

wherein R is selected from the group consisting of hydrogen, alkyl, cycloalkyl, aryl, heterocyclic alkyl, and heterocyclic aryl, each of which may be substituted or unsubstituted; (c) a cationic monomer compound; and (d) water, wherein the polishing composition has a pH of about 5.5 to about 8, (iv) contacting a substrate with a polishing pad and a chemical-mechanical polishing composition, and (v) moving the polishing pad and the chemical-mechanical polishing composition relative to the substrate to abrade at least a portion of the substrate to polish the substrate.

DETAILED DESCRIPTION OF THE INVENTION

The invention provides a chemical-mechanical polishing composition comprising, consisting essentially of, or consisting of: (a) an abrasive selected from a ceria abrasive, a zirconia abrasive, and a combination thereof (b) a self-stopping agent selected from a compound of formula (I):

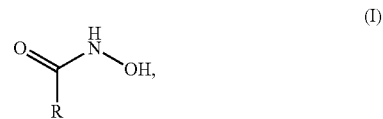

wherein R is selected from the group consisting of hydrogen, alkyl, cycloalkyl, aryl, heterocyclic alkyl, and heterocyclic aryl, each of which may be substituted or unsubstituted; (c) optionally a nonionic polymer; (d) a cationic monomer compound; and (e) water, wherein the polishing composition has a pH of about 5.5 to about 8.

The chemical-mechanical polishing composition of the invention comprises an abrasive. The abrasive of the polishing composition desirably is suitable for polishing a non-metal portion of the substrate (e.g., pattern dielectric material, blanket dielectric material, pattern oxide material, blanket oxide material, etc.). Suitable abrasives include a ceria abrasive (e.g., $CeO_2$), a zirconia abrasive (e.g., $ZrO_2$), and a combination thereof.

Both ceria abrasives and zirconia abrasives are well known in the CMP art and are commercially available. Examples of suitable ceria abrasives include wet-process ceria, calcined ceria, and metal-doped ceria, among others. Examples of suitable zirconia abrasives include metal-doped zirconia and non-metal-doped zirconia, among others. Among metal doped zirconia are cerium-, calcium-, magnesium-, or yttrium-doped zirconia with dopant element weight percentage preferentially in a range from 0.1% to 25%.

In some embodiments, the chemical-mechanical polishing composition comprises a ceria abrasive. As used herein, the term "ceria abrasive" can be used interchangeably with "ceria abrasive particles," "ceria particles," or "abrasive." As is well known, ceria is an oxide of the rare earth metal cerium, and is also known as ceric oxide, cerium oxide (e.g., cerium(IV) oxide), or cerium dioxide. Cerium (IV) oxide ($CeO_2$) can be formed by calcining cerium oxalate or cerium hydroxide. Cerium also forms cerium(III) oxides such as, for example, $Ce_2O_3$. The ceria abrasive particles can comprise any one or more of these or other oxides of ceria.

The ceria abrasive particles can be of any suitable type. In an embodiment, the ceria abrasive particles comprise, consist essentially of, or consist of calcined ceria particles, wet ceria particles, wet-based process ceria particles or combinations thereof. Ceria abrasives suitable for use in the inventive polishing compositions, and processes for their preparation, are described in U.S. patent application Ser. No. 14/639,564, filed Mar. 5, 2015, entitled "Polishing Composition Containing Ceria Abrasive," now U.S. Pat. No. 9,505,952, and U.S. patent application Ser. No. 15/207,973, filed Jul. 12, 2016, entitled "Methods and Compositions for Processing Dielectric Substrate," published as U.S. Patent Application Publication No. 2017/0014969, the disclosures of which are incorporated by reference herein.

In a preferred embodiment, the ceria abrasive particles comprise wet ceria particles or wet process-based ceria particles. As used herein, "wet ceria particles" or "wet process-based ceria particles" (collectively herein "wet process" ceria particles) refers to a ceria prepared by a precipitation, condensation-polymerization, or similar process (as opposed to, for example, fumed or pyrogenic ceria). A polishing composition of the invention comprising wet-process ceria particles has been found to exhibit lower defects when used to polish substrates according to a method of the invention. Without wishing to be bound to a particular theory, it is believed that wet-process ceria comprises approximately spherical ceria particles and/or smaller aggregate ceria particles, thereby resulting in lower substrate defectivity when used in the inventive method. Illustrative examples of wet-process ceria are HC30™ and HC60™ ceria commercially available from Rhodia and Hybrid-30 commercially available from ANP Co., Ltd.

The ceria abrasive can be made by any suitable process. As an example, the ceria abrasive can be wet-process ceria particles made according to the following process. Typically, the first step in synthesizing wet-process ceria particles is to dissolve a ceria precursor in water. The ceria precursor can be any suitable ceria precursor, and can include a ceria salt having any suitable charge, e.g., Ce' or Ce'. Suitable ceria precursors include, for example, cerium III nitrate, cerium IV ammonium nitrate, cerium III carbonate, cerium IV sulfate, and cerium III chloride. Preferably, the ceria precursor is cerium III nitrate.

The pH of the ceria precursor solution typically is increased to form amorphous $Ce(OH)_3$. The pH of the solution can be increased to any suitable pH. For example, the pH of the solution can be increased to a pH of about 10 or more, e.g., a pH of about 10.5 or more, a pH of about 11 or more, or a pH of about 12 or more. Typically, the solution will have a pH of about 14 or less, e.g., a pH of about 13.5 or less, or a pH of about 13 or less. Any suitable base can be used to increase the pH of the solution. Suitable bases include, for example, KOH, NaOH, $NH_4OH$, and tetramethylammonium hydroxide. Organic bases such as, for example, ethanolamine and diethanolamine, also are suitable. The solution will become white and cloudy as the pH increases and amorphous $Ce(OH)_3$ is formed.

The ceria precursor solution typically is mixed for several hours. For example, the solution can be mixed for about 1 hour or more, e.g., about 2 hours or more, about 4 hours or more, about 6 hours or more, about 8 hours or more, about 12 hours or more, about 16 hours or more, about 20 hours or more, or about 24 hours or more. Typically, the solution is mixed for about 1 hour to about 24 hours, e.g., about 2 hours, about 8 hours, or about 12 hours. When mixing is complete, the solution can be transferred to a pressurized vessel and heated.

The ceria precursor solution can be heated to any suitable temperature. For example, the solution can be heated to a temperature of about 50° C. or more, e.g., about 75° C. or more, about 100° C. or more, about 125° C. or more, about 150° C. or more, about 175° C. or more, or about 200° C. or more. Alternatively, or in addition, the solution can be heated to a temperature of about 500° C. or less, e.g., about 450° C. or less, about 400° C. or less, about 375° C. or less, about 350° C. or less, about 300° C. or less, about 250° C. or less, about 225° C., or about 200° C. or less. Thus, the solution can be heated to a temperature within a range bounded by any two of the aforementioned endpoints. For example, the solution can be heated to a temperature of about 50° C. to about 300° C., e.g., about 50° C. to about 275° C., about 50° C. to about 250° C., about 50° C. to about 200° C., about 75° C. to about 300° C., about 75° C. to about 250° C., about 75° C. to about 200° C., about 100° C. to about 300° C., about 100° C. to about 250° C., or about 100° C. to about 225° C.

The ceria precursor solution typically is heated for several hours. For example, the solution can be heated for about 1 hour or more, e.g., about 5 hours or more, about 10 hours or more, about 25 hours or more, about 50 hours or more, about 75 hours or more, about 100 hours or more, or about 110 hours or more. Alternatively, or in addition, the solution can be heated for about 200 hours or less, e.g., about 180 hours or less, about 165 hours or less, about 150 hours or less, about 125 hours or less, about 115 hours or less, or about 100 hours or less. Thus, the solution can be heated for a time period bounded by any two of the aforementioned endpoints. For example, the solution can be heated for about 1 hour to about 150 hours, e.g., about 5 hours to about 130 hours, about 10 hours to about 120 hours, about 15 hours to about 115 hours, or about 25 hours to about 100 hours.

After heating, the ceria precursor solution can be filtered to separate the precipitated ceria particles. The precipitant can be rinsed with excess water to remove unreacted ceria precursor. The mixture of precipitant and excess water can be filtered following each rinse step to remove impurities. Once adequately rinsed, the ceria particles can be dried for additional processing, e.g., sintering, or the ceria particles can be directly redispersed.

The ceria particles optionally can be dried and sintered prior to redispersion. The terms "sintering" and "calcining" are used interchangeably herein to refer to the heating of the ceria particles under the conditions described below. Sintering the ceria particles impacts their resulting crystallinity. Without wishing to be bound by any particular theory, it is believed that sintering the ceria particles at high temperatures and for extended periods of time reduces defects in the crystal lattice structure of the particles. Any suitable method can be used to sinter the ceria particles. As an example, the ceria particles can be dried, and then can be sintered at an elevated temperature. Drying can be carried out at room temperature, or at an elevated temperature. In particular, drying can be carried out at a temperature of about 20° C. to about 40° C., e.g., about 25° C., about 30° C., or about 35° C. Alternatively, or in addition, drying can be carried out at an elevated temperature of about 80° C. to about 150° C., e.g., about 85° C., about 100° C., about 115° C., about 125° C., or about 140° C. After the ceria particles have been dried, they can be ground to create a powder. Grinding can be carried out using any suitable grinding material, such as zirconia.

The ceria particles can be sintered in any suitable oven, and at any suitable temperature. For example, the ceria particles can be sintered at a temperature of about 200° C. or more, e.g., about 215° C. or more, about 225° C. or more, about 250° C. or more, about 275° C. or more, about 300° C. or more, about 350° C. or more, or about 375° C. or more. Alternatively, or in addition, the ceria particles can be sintered at a temperature of about 1000° C. or less, e.g., about 900° C. or less, about 750° C. or less, about 650° C. or less, about 550° C. or less, about 500° C. or less, about 450° C. or less, or about 400° C. or less. Thus, the ceria particles can be sintered at a temperature bounded by any two of the aforementioned endpoints. For example, the ceria particles can be sintered at a temperature of about 200° C. to about 1000° C., e.g., about 250° C. to about 800° C., about 300° C. to about 700° C., about 325° C. to about 650° C., about 350° C. to about 600° C., about 350° C. to about 550° C., about 400° C. to about 550° C., about 450° C. to about 800° C., about 500° C. to about 1000° C., or about 500° C. to about 800° C.

The ceria particles can be sintered for any suitable length of time. For example, the ceria particles can be sintered for about 1 hour or more, e.g., about 2 hours or more, about 5 hours or more, or about 8 hours or more. Alternatively, or in addition, the ceria particles can be sintered for about 20 hours or less, e.g., about 18 hours or less, about 15 hours or less, about 12 hours or less, or about 10 hours or less. Thus, the ceria particles can be sintered for a time period bounded by any two of the aforementioned endpoints. For example, the ceria particles can be sintered for about 1 hour to about 20 hours, e.g., about 1 hour to about 15 hours, about 1 hour to about 10 hours, about 1 hour to about 5 hours, about 5 hours to about 20 hours, or about 10 hours to about 20 hours.

The ceria particles also can be sintered at various temperatures and for various lengths of time within the ranges described above. For example, the ceria particles can be sintered in a zone furnace, which exposes the ceria particles to one or more temperatures for various lengths of time. As an example, the ceria particles can be sintered at a temperature of about 200° C. to about 1000° C. for about 1 hour or more, and then can be sintered at a different temperature that is within the range of about 200° C. to about 1000° C. for about 1 hour or more.

The ceria particles typically are redispersed in a suitable carrier, e.g., an aqueous carrier, particularly water. If the ceria particles are sintered, then the ceria particles are redispersed after the completion of sintering. Any suitable process can be used to redisperse the ceria particles. Typically, the ceria particles are redispersed by lowering the pH of a mixture of the ceria particles and water using a suitable acid. As the pH is lowered, the surface of the ceria particles develops a positive zeta potential. This positive zeta potential creates repulsion forces between the ceria particles, which facilitates their redispersion. Any suitable acid can be used to lower the pH of the mixture. Suitable acids include, for example hydrochloric acid and nitric acid. Organic acids which are highly water-soluble and have hydrophilic functional groups also are suitable. Suitable organic acids include, for example, acetic acid. Acids with multivalent anions, such as $H_3PO_4$ and $H_2SO_4$, generally are not preferred. The pH of the mixture can be lowered to any suitable pH. For example, the pH of the mixture can be lowered to about 2 to about 5, e.g., about 2.5, about 3, about 3.5, about 4, or about 4.5. Typically, the pH of the mixture is not lowered to less than about 2.

The redispersed ceria particles typically are milled to reduce their particle size. Preferably, the ceria particles are milled simultaneously with redispersion. Milling can be carried out using any suitable milling material, such as zirconia. Milling also can be carried out using sonication or wet-jet procedures. After milling, the ceria particles can be filtered to remove any remaining large particles. For example, the ceria particles can be filtered using a filter having a pore size of about 0.3 µm or more, e.g., about 0.4 µm or more, or about 0.5 µm or more.

The ceria abrasive can have any suitable average particle size (i.e., average particle diameter). If the average ceria abrasive particle size is too small, the polishing composition may not exhibit sufficient removal rate. In contrast, if the average ceria abrasive particle size is too large, the polishing composition may exhibit undesirable polishing performance such as, for example, poor substrate defectivity. Accordingly, the ceria abrasive particles can have an average particle size of about 10 nm or more, for example, about 15 nm or more, about 20 nm or more, about 25 nm or more, about 30 nm or more, about 35 nm or more, about 40 nm or more, about 45 nm or more, or about 50 nm or more. Alternatively, or in addition, the ceria abrasive particles can have an average particle size of about 1,000 nm or less, for example, about 750 nm or less, about 500 nm or less, about 250 nm or less, about 150 nm or less, about 100 nm or less, about 75 nm or less, or about 50 nm or less. Thus, the ceria abrasive particles can have an average particle size bounded by any two of the aforementioned endpoints. For example, the ceria abrasive particles can have an average particle size of about 10 nm to about 1,000 nm, e.g., about 10 nm to about 750 nm, about 15 nm to about 500 nm, about 20 nm to about 250 nm, about 20 nm to about 150 nm, about 25 nm to about 150 nm, about 25 nm to about 100 nm, about 50 nm to about 150 nm, or about 50 nm to about 100 nm. For spherical ceria abrasive particles, the size of the particle is the diameter of the particle. For non-spherical ceria particles, the size of the particle is the diameter of the smallest sphere that encompasses the particle. The particle size of the ceria abrasive particles can be measured using any suitable technique, for example, using laser diffraction techniques. Suitable particle size measurement instruments are available from, for example, Malvern Instruments (Malvern, UK).

In some embodiments, the ceria abrasive particles of the polishing composition exhibit a multimodal particle size distribution. As used herein, the term "multimodal" means that the ceria abrasive particles exhibit an average particle size distribution having at least 2 maxima (e.g., 2 or more maxima, 3 or more maxima, 4 or more maxima, or 5 or more maxima). Preferably, in these embodiments, the ceria abrasive particles exhibit a bimodal particle size distribution, i.e., the ceria abrasive particles exhibit a particle size distribution having 2 average particle size maxima. The terms "maximum" and "maxima" mean a peak or peaks in the particle size distribution. The peak or peaks correspond to the average particle sizes described herein for the ceria abrasive particles. Thus, for example, a plot of the number of particles versus particle size will reflect a bimodal particle size distribution, with a first peak in the particle size range of about 75 nm to about 150 nm, for example, about 80 nm to about 140 nm, about 85 nm to about 130 nm, or about 90 nm to about 120 nm, and a second peak in the particle size range of about 25 nm to about 70 nm, for example, about 30 nm to about 65 nm, about 35 nm to about 65 nm, or about 40 nm to about 60 nm. The ceria abrasive particles having a multimodal particle size distribution can be obtained by combining two different ceria abrasive particles each having a monomodal particle size distribution.

The ceria abrasive particles preferably are colloidally stable in the inventive polishing composition. The term colloid refers to the suspension of ceria abrasive particles in the aqueous carrier (e.g., water). Colloidal stability refers to the maintenance of that suspension through time. In the context of this invention, an abrasive is considered colloidally stable if, when the abrasive is placed into a 100 mL graduated cylinder and allowed to stand unagitated for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the initial concentration of particles in the abrasive composition ([C] in terms of g/mL) is less than or equal to 0.5 (i.e., $\{[B]-[T]\}/[C] \leq 0.5$). More preferably, the value of [B]−[T]/[C] is less than or equal to 0.3, and most preferably is less than or equal to 0.1.

The polishing composition can comprise any suitable amount of abrasive (e.g., a ceria abrasive, a zirconia abrasive, or a combination thereof). If the polishing composition of the invention comprises too little abrasive, the composition may not exhibit a sufficient removal rate. In contrast, if the polishing composition comprises too much abrasive, then the polishing composition may exhibit undesirable polishing performance and/or may not be cost effective and/or may lack stability. The polishing composition comprises about 10 wt. % or less of the abrasive (e.g., a ceria abrasive, a zirconia abrasive, or a combination thereof), for example, about 9 wt. % or less, about 8 wt. % or less, about 7 wt. % or less, about 6 wt. % or less, about 5 wt. % or less, about 4 wt. % or less, about 3 wt. % or less, about 2 wt. % or less, about 1 wt. % or less, about 0.9 wt. % or less, about 0.8 wt. % or less, about 0.7 wt. % or less, about 0.6 wt. % or less, or about 0.5 wt. % or less. Alternatively, or in addition, the polishing composition comprises about 0.001 wt. % or more of the abrasive (e.g., a ceria abrasive, a zirconia abrasive, or a combination thereof), for example, about 0.005 wt. % or more, about 0.01 wt. % or more, about 0.05 wt. % or more, or about 0.1 wt. % or more. Thus, the abrasive (e.g., a ceria abrasive, a zirconia abrasive, or a combination thereof) can be present in the polishing composition in an amount bounded by any two of the aforementioned endpoints. For example, the polishing composition can comprise about 0.001 wt. % to about 10 wt. % of the abrasive (e.g., a ceria abrasive, a zirconia abrasive, or a combination thereof), for example, about 0.001 wt. % to about 9 wt. %, about 0.005 wt. % to about 8 wt. %, about 0.01 wt. % to about 7 wt. %, about 0.05 wt. % to about 6 wt. %, about 0.1 wt. % to about 5 wt. %, about 0.5 wt. % to about 5 wt. %, about 0.5 wt. % to about 4 wt. %, about 1 wt. % to about 3 wt. %, or about 1.5 wt. % to about 2.5 wt. %. In an embodiment, the polishing composition can comprise, at the point-of-use, about 0.1 wt. % to about 1 wt. % or about 0.1 wt. % to about 0.5 wt. % of the abrasive (e.g., a ceria abrasive, a zirconia abrasive, or a combination thereof). In another embodiment, the polishing composition comprises, as a concentrate, about 1-3 wt. % (e.g., about 1.2 wt. % or about 1.6 wt. %) of the abrasive (e.g., a ceria abrasive, a zirconia abrasive, or a combination thereof).

The polishing composition comprises a self-stopping agent. The self-stopping agent can be any suitable compound that is capable of reducing the removal rate of one or more of silicon oxide and polysilicon. In some embodiments, the self-stopping agent is of formula (I):

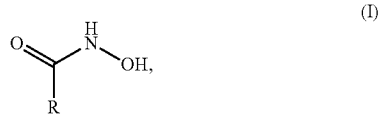

(I)

wherein R is selected from the group consisting of hydrogen, alkyl, heteroalkyl, cycloalkyl, heterocycloalkyl, aryl, heteroaryl, each of which may be substituted or unsubstituted.

As used herein, the term "alkyl" refers to a straight or branched, saturated or unsaturated, aliphatic radical having the number of carbon atoms indicated. Alkyl can include any number of carbons, such as $C_{1-2}$, $C_{1-3}$, $C_{1-4}$, $C_{1-5}$, $C_{1-6}$, $C_{1-7}$, $C_{1-8}$, $C_{1-9}$, $C_{1-10}$, $C_{2-3}$, $C_{2-4}$, $C_{2-5}$, $C_{2-6}$, $C_{3-4}$, $C_{3-5}$, $C_{3-6}$, $C_{4-5}$, $C_{4-6}$ and $C_{5-6}$. For example, $C_{1-6}$ alkyl includes, but is not limited to, methyl, ethyl, propyl, isopropyl, butyl, isobutyl, sec-butyl, tert-butyl, pentyl, isopentyl, hexyl, etc. Alkyl can also refer to alkyl groups having up to 30 carbons atoms, such as, but not limited to heptyl, octyl, nonyl, decyl, etc. Alkyl groups can be substituted or unsubstituted. "Substituted alkyl" groups can be substituted with one or more groups selected from halo, hydroxy, amino, oxo (=O), alkylamino, amido, acyl, nitro, cyano, and alkoxy.

As used herein, the term "heteroalkyl" refers to an alkyl group as described herein, wherein one or more carbon atoms are optionally and independently replaced with a heteroatom selected from N, O, and S.

As used herein, the term "cycloalkyl" refers to a saturated or partially unsaturated, monocyclic, fused bicyclic, or bridged polycyclic ring assembly containing from 3 to 12 ring atoms, or the number of atoms indicated. Cycloalkyl groups can include any number of carbons, such as $C_{3-6}$, $C_{4-6}$, $C_{5-6}$, $C_{3-8}$, $C_{4-8}$, $C_{5-8}$, $C_{6-8}$, $C_{3-9}$, $C_{3-10}$, $C_{3-11}$, and $C_{3-12}$. Saturated monocyclic carbocyclic rings include, for example, cyclopropyl, cyclobutyl, cyclopentyl, cyclohexyl, and cyclooctyl. Saturated bicyclic and polycyclic carbocyclic rings include, for example, norbornane, [2.2.2]bicyclooctane, decahydronaphthalene and adamantane. Carbocyclic groups can also be partially unsaturated, having one or more double or triple bonds in the ring. Representative carbocyclic groups that are partially unsaturated include, but are not limited to, cyclobutene, cyclopentene, cyclohexene, cyclohexadiene (1,3- and 1,4-isomers), cycloheptene, cycloheptadiene, cyclooctene, cyclooctadiene (1,3-, 1,4- and 1,5-isomers), norbornene, and norbornadiene.

As used herein, the term "heterocycloalkyl" refers to a cycloalkyl group as described herein, wherein one or more carbon atoms are optionally and independently replaced with a heteroatom selected from N, O, and S.

As used herein, the term "aryl" refers to an aromatic ring system having any suitable number of ring atoms and any suitable number of rings. Aryl groups can include any suitable number of ring atoms, such as, 6, 7, 8, 9, 10, 11, 12, 13, 14, 15 or 16 ring atoms, as well as from 6 to 10, 6 to 12, or 6 to 14 ring members. Aryl groups can be monocyclic, fused to form bicyclic or tricyclic groups, or linked by a bond to form a biaryl group. Representative aryl groups include phenyl, naphthyl and biphenyl. Other aryl groups include benzyl, having a methylene linking group. Some aryl groups have from 6 to 12 ring members, such as phenyl, naphthyl or biphenyl. Other aryl groups have from 6 to 10 ring members, such as phenyl or naphthyl.

As used herein, the term "heteroaryl" refers to an aryl group as described herein, wherein one or more carbon atoms are optionally and independently replaced with a heteroatom selected from N, O, and S.

In certain embodiments, the self-stopping agent is selected from hydroxamic acid, acetohydroxamic acid, benzhydroxamic acid (benzohydroxamic acid), salicylhydroxamic acid, and combinations thereof.

The polishing composition can comprise any suitable amount of the self-stopping agent. The polishing composition can comprise about 10 ppm or more of the self-stopping agent, for example, about 15 ppm or more, about 20 ppm or more, about 25 ppm or more, about 30 ppm or more, about 35 ppm or more, or about 40 ppm or more. Alternatively, or in addition, the polishing composition can comprise about 5000 ppm or less of the self-stopping agent, for example, about 3000 ppm or less, about 1000 ppm or less, about 800 ppm or less, about 600 ppm or less, about 400 ppm or less, about 200 ppm or less, or about 100 ppm or less. Thus, the polishing composition can comprise the self-stopping agent in an amount bounded by any two of the aforementioned endpoints. For example, the polishing composition can comprise about 10 ppm to about 5000 ppm of the self-stopping agent, e.g., about 10 ppm to about 3000 ppm, about 10 ppm to about 1000 ppm, about 10 ppm to about 800 ppm, about 10 ppm to about 600 ppm, about 10 ppm to about 400 ppm, about 10 ppm to about 200 ppm, about 10 ppm to about 100 ppm, about 25 ppm to about 5000 ppm, about 25 ppm to about 3000 ppm, about 25 ppm to about 1000 ppm, about 25 ppm to about 800 ppm, about 25 ppm to about 600 ppm, about 25 ppm to about 400 ppm, about 25 ppm to about 200 ppm, or about 25 ppm to about 100 ppm.

Without wishing to be bound by any particular theory, it is believed that the self-stopping agent facilitates a non-linear response to a given down force (DF) on tetraethoxysilane (TEOS) blanket dielectric materials. During polishing, pattern dielectric material experiences an effective downforce (DF) higher than that of blanket dielectric material, because contact is spread over only some portions of the pattern dielectric material which are making contact with the pad. A higher effective DF applied to a TEOS pattern dielectric material results in a "high" removal rate (e.g., pattern removal rate) polishing regime having a TEOS removal rate of about 8,000 Å/min, wherein a lower effective DF results in a "stopping" polishing regime having a TEOS removal rate of about 1,000 Å/min or less (e.g., blanket removal rate). The difference between the "high" regime and the "stopping" regime typically is distinct such that for a given DF either a "high" removal rate, or a "stopping" removal rate is observed. Accordingly, it is believed that the self-stopping agent desirably enables a "high" removal rate (i.e., a pattern removal rate) even when the applied DF is in the "stopping" regime as determined with blanket wafers.

Moreover, it also noted that the mechanism is not solely dependent on DF since the trench oxide removal rate on pattern dielectric material is higher than the blanket removal rate despite having a lower effective DF in the trenches than on the blanket wafers. For example, in some polishing applications, the concentration of the self-stopping agent plays a role in the observed effect since at low concentrations, the self-stopping agent can act as a rate enhancer (e.g., a "high" removal rate is observed) and at higher concentrations the self-stopping behavior is observed (e.g., a "stopping" removal rate is observed). Accordingly, some rate enhancers can have dual action. By way of example, when a polishing composition comprises picolinic acid in lower concentrations, the picolinic acid can function as a rate enhancer. However, when the polishing composition comprises picolinic acid in higher concentrations, the picolinic acid can function as a self-stopping agent. Typically, picolinic acid functions as a rate enhancer at concentrations less than about 1000 ppm, on a weight basis (e.g., about 500 ppm, about 250 ppm, etc).

The chemical-mechanical polishing composition comprises a cationic monomer compound. The cationic monomer compound can be any suitable cationic (e.g., ammonium) compound recognized by a skilled artisan as being capable of undergoing polymerization (e.g., through radical polymerization, addition polymerization, metathesis polymerization, or the like). For example, the cationic monomer compound can be 2-(dimethylamino)ethyl acrylate ("DMAEA"), 2-(dimethylamino)ethyl methacrylate ("DMAEM"), 3-(dimethylamino)propyl methacrylamide ("DMAPMA"), 3-(dimethylamino)propyl acrylamide ("DMAPA"), 3-methacrylamidopropyl-trimethyl-ammonium chloride ("MAPTAC"), 3-acrylamidopropyl-trimethyl-ammonium chloride ("APTAC"), diallyldimethylammonium chloride ("DADMAC"), 2-(acryloyloxy)-N,N,N-trimethylethanaminium chloride ("DMAEA.MCQ"), 2-(methacryloyloxy)-N,N,N-trimethylethanaminium chloride ("DMAEM.MCQ"), N,N-dimethylaminoethyl acrylate benzyl chloride ("DMAEA.BCQ"), N,N-dimethylaminoethyl methacrylate benzyl chloride ("DMAEM.BCQ"), salts thereof, and combinations thereof. In certain embodiments, the cationic monomer compound is selected from diallyldimethylammonium chloride ("DADMAC"), 2-(acryloyloxy)-N,N,N-trimethylethanaminium chloride ("DMAEA.MCQ"), 2-(methacryloyloxy)-N,N,N-trimethylethanaminium chloride ("DMAEM.MCQ"), salts thereof, and combinations thereof. In preferred embodiments, the cationic monomer compound is diallyldimethylammonium chloride ("DADMAC") or a salt thereof.

The polishing composition can comprise any suitable amount of the cationic monomer compound. The polishing composition can comprise about 10 ppm or more of the cationic monomer compound, for example, about 15 ppm or more, about 20 ppm or more, about 25 ppm or more, about 30 ppm or more, about 35 ppm or more, or about 40 ppm or more. Alternatively, or in addition, the polishing composition can comprise about 1000 ppm or less of the cationic monomer compound, for example, about 800 ppm or less, about 600 ppm or less, about 400 ppm or less, about 200 ppm or less, or about 100 ppm or less. Thus, the polishing composition can comprise the cationic monomer compound in an amount bounded by any two of the aforementioned endpoints. For example, the polishing composition can comprise about 10 ppm to about 1000 ppm of the cationic monomer compound, e.g., about 10 ppm to about 800 ppm, about 10 ppm to about 600 ppm, about 10 ppm to about 400 ppm, about 10 ppm to about 200 ppm, about 10 ppm to about 100 ppm, about 25 ppm to about 1000 ppm, about 25 ppm to about 800 ppm, about 25 ppm to about 600 ppm, about 25 ppm to about 400 ppm, about 25 ppm to about 200 ppm, or about 25 ppm to about 100 ppm.

In some embodiments, the polishing composition further comprises a nonionic polymer. Thus, in some aspects, the invention provides a chemical-mechanical polishing composition comprising, consisting essentially of, or consisting of: (a) an abrasive selected from a ceria abrasive, a zirconia abrasive, and a combination thereof; (b) a self-stopping agent selected from a compound of formula (I):

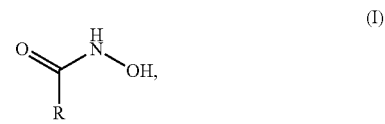

wherein R is selected from the group consisting of hydrogen, alkyl, cycloalkyl, aryl, heterocyclic alkyl, and heterocyclic aryl, each of which may be substituted or unsubstituted; (c) a nonionic polymer; (d) a cationic monomer compound; and (e) water, wherein the polishing composition has a pH of about 5.5 to about 8.

The nonionic polymer can be any suitable polymer without a cationic or anionic charge at a pH of about 5.5 to about 8. In some embodiments, the nonionic polymer is selected from polyalkylene glycols, polyetheramines, polyethylene oxide/polypropylene oxide copolymers, polyacrylamide, polyvinylpyrrolidone, siloxane polyalkyleneoxide copolymers, hydrophobically modified polyacrylate copolymers, hydrophilic nonionic polymers, polysaccharides, and combinations thereof. In certain embodiments, the nonionic polymer is polyvinylpyrrolidone, polyalkylene glycol (e.g., polyethylene glycol (PEG) or polypropylene oxide (PPO)), a polyethylene oxide/polypropylene oxide copolymer, or a combination thereof. In preferred embodiments, the nonionic polymer is polyethylene glycol (PEG).

The nonionic polymer can have any suitable weight average molecular weight. The nonionic polymer can have a weight average molecular weight of about 400 g/mol or more, for example, about 500 g/mol or more, about 600 g/mol or more, about 750 g/mol or more, about 1,000 g/mol or more, about 1,500 g/mol or more, about 2,000 g/mol or more, about 2,500 g/mol or more, about 3,000 g/mol or more, about 3,500 g/mol or more, about 4,000 g/mol or more, about 4,500 g/mol or more, about 5,000 g/mol or more, about 5,500 g/mol or more, about 6,000 g/mol or more, about 6,500 g/mol or more, about 7,000 g/mol or more, or about 7,500 g/mol or more. Alternatively, or in addition, the nonionic polymer can have a weight average molecular weight of about 20,000 g/mol or less, for example, about 10,000 g/mol or less, about 9,000 g/mol or less, about 8,000 g/mol or less, about 7.500 g/mol or less, about 7,000 g/mol or less, about 6,500 g/mol or less, about 6,000 g/mol or less, about 5,500 g/mol or less, about 5.000 g/mol or less, about 4,500 g/mol or less, about 4.000 g/mol or less, about 3,500 g/mol or less, about 3,000 g/mol or less, about 2,500 g/mol or less, or about 2,000 g/mol or less. Thus, the nonionic polymer can have a weight average molecular weight bounded by any two of the aforementioned endpoints. For example, the nonionic polymer can have a weight average molecular weight of about 400 g/mol to about 20,000 g/mol, e.g., about 400 g/mol to about 10,000 g/mol, about 400 g/mol to about 9,000 g/mol, about 400 g/mol to about 8,000 g/mol, about 400 g/mol to about 7,000 g/mol, about 400 g/mol to about 6,000 g/mol, about 400 g/mol to about 5,000 g/mol, about 1000 g/mol to about 20,000 g/mol, about 1000 g/mol to about 10,000 g/mol, about 1000 g/mol to about 9,000 g/mol, about 1000 g/mol to about 8,000 g/mol, about 1000 g/mol to about 7,000 g/mol, about 1000 g/mol to about 6,000 g/mol, or about 1000 g/mol to about 5,000 g/mol.

The polishing composition can comprise any suitable amount of the nonionic polymer, when present. The polishing composition can comprise about 25 ppm or more of the nonionic polymer, for example, about 50 ppm or more, about 100 ppm or more, or about 200 ppm or more. Alternatively, or in addition, the polishing composition can comprise about 5000 ppm or less of the nonionic polymer, for example, about 4000 ppm or less, about 3000 ppm or less, about 2000 ppm or less, or about 1000 ppm or less. Thus, the polishing composition can comprise the nonionic polymer in an amount bounded by any two of the aforementioned endpoints. For example, the polishing composition can comprise about 25 ppm to about 5000 ppm of the nonionic polymer, e.g., about 25 ppm to about 400 ppm, about 25 ppm to about 3000 ppm, about 25 ppm to about 2000 ppm, about 25 ppm to about 1000 ppm, about 50 ppm to about 5000 ppm, about 50 ppm to about 4000 ppm, about 50 ppm to about 3000 ppm, about 50 ppm to about 2000 ppm, about 50 ppm to about 1000 ppm, about 100 ppm to about 5000 ppm, or about 100 ppm to about 1000 ppm.

The polishing composition comprises an aqueous carrier. The aqueous carrier comprises water (e.g., deionized water) and may contain one or more water-miscible organic solvents. Examples of organic solvents that can be used include alcohols such as propenyl alcohol, isopropyl alcohol, ethanol, 1-propanol, methanol, 1-hexanol, and the like; aldehydes such as acetylaldehyde and the like; ketones such as acetone, diacetone alcohol, methyl ethyl ketone, and the like; esters such as ethyl formate, propyl formate, ethyl acetate, methyl acetate, methyl lactate, butyl lactate, ethyl lactate, and the like; ethers including sulfoxides such as dimethyl sulfoxide (DMSO), tetrahydrofuran, dioxane, diglyme, and the like; amides such as N, N-dimethylformamide, dimethylimidazolidinone, N-methylpyrrolidone, and the like; polyhydric alcohols and derivatives of the same such as ethylene glycol, glycerol, diethylene glycol, diethylene glycol monomethyl ether, and the like; and nitrogen-containing organic compounds such as acetonitrile, amylamine, isopropylamine, imidazole, dimethylamine, and the like. Preferably, the aqueous carrier is water alone, i.e., without the presence of an organic solvent.

The chemical-mechanical polishing composition can comprise one or more compounds capable of adjusting (i.e., that adjust) the pH of the polishing composition (i.e., pH adjusting compounds). The pH of the polishing composition can be adjusted using any suitable compound capable of adjusting the pH of the polishing composition. The pH adjusting compound desirably is water-soluble and compatible with the other components of the polishing composition. Typically, the chemical-mechanical polishing composition has a pH of about 5.5 to about 8 at the point-of-use (e.g., a pH of about 5.5 to about 7.5, of about 5.5 to about 7, of about 5.5 to about 6.5, of about 5.5 to about 6, of about 6 to about 8, of about 6 to about 7.5, of about 6 to about 7, of about 6 to about 6.5, of about 7 to about 8, or of about 7 to about 7.5). In certain embodiments, the chemical-mechanical polishing composition has a pH of about 5.5 to about 7 at the point-of-use. Preferably, the chemical-mechanical polishing composition has a pH of about 6 to about 6.5 at the point-of-use.

The compound capable of adjusting and buffering the pH can be selected from the group consisting of alkyl amines, ammonium salts, alkali metal salts, carboxylic acids, alkali metal hydroxides, alkali metal nitrates, alkali metal carbonates, alkali metal bicarbonates, borates, and mixtures thereof.

The chemical-mechanical polishing composition optionally further comprises one or more additives. Illustrative additives include conditioners, acids (e.g., sulfonic acids), complexing agents, chelating agents, biocides, scale inhibitors, and dispersants.

A biocide, when present, can be any suitable biocide and can be present in the polishing composition in any suitable amount. A suitable biocide is an isothiazolinone biocide. The biocide can be present in the polishing composition at a concentration of about 1 to about 750 ppm, preferably about 20 to about 200 ppm.

The polishing composition can be produced by any suitable technique, many of which are known to those skilled in the art. The polishing composition can be prepared in a batch or continuous process. Generally, the polishing composition is prepared by combining the components of the polishing composition. The term "component" as used herein includes individual ingredients (e.g., abrasive, self-stopping agent, cationic monomer compound, optional nonionic polymer, and/or any other optional additive) as well as any combination of ingredients (e.g., abrasive, self-stopping agent, cationic monomer compound, optional nonionic polymer, and/or any other optional additive, etc.).

For example, the polishing composition can be prepared by (i) providing all or a portion of the liquid carrier, (ii) dispersing the abrasive, self-stopping agent, cationic monomer compound, optional nonionic polymer, and/or any other optional additive, using any suitable means for preparing such a dispersion, (iii) adjusting the pH of the dispersion as appropriate, and (iv) optionally adding suitable amounts of any other optional components and/or additives to the mixture.

Alternatively, the polishing composition can be prepared by (i) providing one or more components (e.g., self-stopping agent, cationic monomer compound, optional nonionic polymer, and/or any other optional additive) in an abrasive slurry, (ii) providing one or more components in an additive solution (e.g., self-stopping agent, cationic monomer compound, optional nonionic polymer, and/or any other optional additive), (iii) combining the abrasive slurry and the additive solution to form a mixture, (iv) optionally adding suitable amounts of any other optional additives to the mixture, and (v) adjusting the pH of the mixture as appropriate.

The polishing composition can be supplied as a one-package system comprising abrasive, self-stopping agent, cationic monomer compound, optional nonionic polymer, any other optional additive, and water. Alternatively, the polishing composition of the invention can be supplied as a two-package system comprising an abrasive slurry in a first package and an additive solution in a second package, wherein the abrasive slurry consists essentially of, or consists of, abrasive particles, and water, and wherein the additive solution consists essentially of, or consists of, self-stopping agent, cationic monomer compound, optional nonionic polymer, and/or any other optional additive. The two-package system allows for the adjustment of polishing composition characteristics by changing the blending ratio of the two packages, i.e., the abrasive slurry and the additive solution.

Various methods can be employed to utilize such a two-package polishing system. For example, the abrasive slurry and additive solution can be delivered to the polishing table by different pipes that are joined and connected at the outlet of supply piping. The abrasive slurry and additive solution can be mixed shortly or immediately before polishing, or can be supplied simultaneously on the polishing table. Furthermore, when mixing the two packages, deionized water can be added, as desired, to adjust the polishing composition and resulting substrate polishing characteristics.

Similarly, a three-, four-, or more package system can be utilized in connection with the invention, wherein each of multiple containers contains different components of the inventive chemical-mechanical polishing composition, one or more optional components, and/or one or more of the same components in different concentrations.

In order to mix components contained in two or more storage devices to produce the polishing composition at or near the point-of-use, the storage devices typically are provided with one or more flow lines leading from each storage device to the point-of-use of the polishing composition (e.g., the platen, the polishing pad, or the substrate surface). As utilized herein, the term "point-of-use" refers to the point at which the polishing composition is applied to the substrate surface (e.g., the polishing pad or the substrate surface itself). By the term "flow line" is meant a path of flow from an individual storage container to the point-of-use of the component stored therein. The flow lines can each lead directly to the point-of-use, or two or more of the flow lines can be combined at any point into a single flow line that leads to the point-of-use. Furthermore, any of the flow lines (e.g., the individual flow lines or a combined flow line) can first lead to one or more other devices (e.g., pumping device, measuring device, mixing device, etc.) prior to reaching the point-of-use of the component(s).

The components of the polishing composition can be delivered to the point-of-use independently (e.g., the components are delivered to the substrate surface whereupon the components are mixed during the polishing process), or one or more of the components can be combined before delivery to the point-of-use, e.g., shortly or immediately before delivery to the point-of-use. Components are combined "immediately before delivery to the point-of-use" if the components are combined about 5 minutes or less prior to being added in mixed form onto the platen, for example, about 4 minutes or less, about 3 minutes or less, about 2 minutes or less, about 1 minute or less, about 45 seconds or less, about 30 seconds or less, about 10 seconds or less prior to being added in mixed form onto the platen, or simultaneously to the delivery of the components at the point-of-use (e.g., the components are combined at a dispenser). Components also are combined "immediately before delivery to the point-of-use" if the components are combined within 5 m of the point-of-use, such as within 1 m of the point-of-use or even within 10 cm of the point-of-use (e.g., within 1 cm of the point-of-use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing slurry are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

The polishing composition also can be provided as a concentrate which is intended to be diluted with an appropriate amount of water prior to use. In such an embodiment, the polishing composition concentrate comprises the components of the polishing composition in amounts such that, upon dilution of the concentrate with an appropriate amount of water, each component of the polishing composition will be present in the polishing composition in an amount within the appropriate range recited above for each component. For example, the abrasive, self-stopping agent, cationic monomer compound, optional nonionic polymer, and/or any other optional additive can each be present in the concentrate in an amount that is about 2 times (e.g., about 3 times, about 4 times, or about 5 times) greater than the concentration recited above for each component so that, when the concentrate is diluted with an equal volume of water (e.g., 2 equal volumes water, 3 equal volumes of water, or 4 equal volumes of water, respectively), each component will be present in the polishing composition in an amount within the ranges set forth above for each component. Furthermore, as will be understood by those of ordinary skill in the art, the concentrate can contain an appropriate fraction of the water present in the final polishing composition in order to ensure that the abrasive particles, self-stopping agent, cationic monomer compound, optional nonionic polymer, and/or any other optional additive are at least partially or fully dissolved in the concentrate.

The invention further provides a method of chemically-mechanically polishing a substrate comprising: (i) providing a substrate, (ii) providing a polishing pad, (iii) providing a chemical-mechanical polishing composition comprising: (a) an abrasive selected from a ceria abrasive, a zirconia abrasive, and a combination thereof; (b) a self-stopping agent selected from a compound of formula (I):

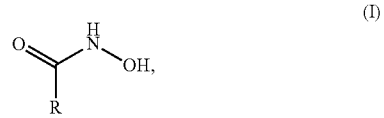

wherein R is selected from the group consisting of hydrogen, alkyl, cycloalkyl, aryl, heterocyclic alkyl, and heterocyclic aryl, each of which may be substituted or unsubstituted; (c) optionally a nonionic polymer; (d) a cationic monomer compound; and (e) water, wherein the polishing composition has a pH of about 5.5 to about 8, (iv) contacting a substrate with a polishing pad and a chemical-mechanical polishing composition, and (v) moving the polishing pad and the chemical-mechanical polishing composition relative to the substrate to abrade at least a portion of the substrate to polish the substrate.

The chemical-mechanical polishing composition can be used to polish any suitable substrate and is especially useful for polishing substrates comprising at least one layer (typically a surface layer) comprised of a low dielectric material. Suitable substrates include wafers used in the semiconductor industry. The wafers typically comprise or consist of, for example, a metal, metal oxide, metal nitride, metal composite, metal alloy, or combinations thereof. The method of the invention is particularly useful for polishing substrates comprising silicon oxide and/or polysilicon, e.g., any one or all of the aforementioned materials. In some embodiments, the substrate comprises silicon oxide and polysilicon on a surface of the substrate, and at least a portion of the silicon oxide and/or polysilicon on a surface of the substrate is abraded to polish the substrate.

In certain embodiments, the substrate comprises silicon oxide and polysilicon. The polysilicon can be any suitable polysilicon, many of which are known in the art. The polysilicon can have any suitable phase, and can be amorphous, crystalline, or a combination thereof. The silicon oxide similarly can be any suitable silicon oxide, many of which are known in the art. Suitable types of silicon oxide include but are not limited to borophosphosilicate glass (BPSG), high density plasma (HDP) oxides and/or plasma-enhanced tetraethyl ortho silicate (PETEOS) and/or tetraethyl orthosilicate (TEOS), thermal oxide, and undoped silicate glass.

The chemical-mechanical polishing composition of the invention can be tailored to provide effective polishing at the desired polishing ranges selective to specific thin layer materials, while at the same time minimizing surface imperfections, defects, corrosion, erosion and the removal of stop layers. The selectivity can be controlled, to some extent, by altering the relative concentrations of the components of the polishing composition. As used herein, the term "selectivity" refers to the removal rate ratio of two different targeted materials. For example, the selectivity can refer to the removal rate ratios of two different materials or the removal rate ratios of two different topographies (e.g., blanket removal vs. active removal).

When desirable, the chemical-mechanical polishing composition of the invention can provide an active silicon oxide removal rate of at least 8,000 Å/min, for example, of at least 9,000 Å/min, of at least 10,000 Å/min, of at least 11,000 Å/min, or of at least 12,000 Å/min. Alternatively, or additionally, the chemical-mechanical polishing composition of the invention can provide an active silicon oxide removal rate to blanket silicon oxide removal rate selectivity of at least 20:1, for example, of at least 25:1, of at least 30:1, of at least 35:1, or of at least 40:1. In certain embodiments, the chemical-mechanical polishing composition of the invention provides an active silicon oxide removal rate of at least 11,000 Å/min and an active silicon oxide removal rate to blanket silicon oxide removal rate selectivity of at least 25:1. In preferred embodiments, the chemical-mechanical polishing composition of the invention provides an active silicon oxide removal rate of at least 12,000 Å/min and an active silicon oxide removal rate to blanket silicon oxide removal rate selectivity of at least 30:1.

Similarly, in certain aspects, the invention further provides a method of chemically-mechanically polishing a substrate comprising, consisting essentially of, or consisting of: (i) providing a substrate, (ii) providing a polishing pad, (iii) providing a chemical-mechanical polishing composition comprising: (a) an abrasive selected from a ceria abrasive, a zirconia abrasive, and a combination thereof; (b) a self-stopping agent selected from a compound of formula (I):

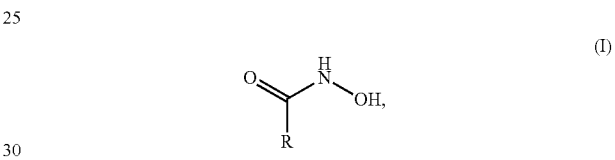

wherein R is selected from the group consisting of hydrogen, alkyl, cycloalkyl, aryl, heterocyclic alkyl, and heterocyclic aryl, each of which may be substituted or unsubstituted; (c) a nonionic polymer; (d) a cationic monomer compound; and (e) water, wherein the polishing composition has a pH of about 5.5 to about 8, (iv) contacting the substrate with the polishing pad and the chemical-mechanical polishing composition, and (v) moving the polishing pad and the chemical-mechanical polishing composition relative to the substrate to abrade at least a portion of the substrate to polish the substrate.

When desirable, the chemical-mechanical polishing composition of the invention can provide selective chemical-mechanical polishing of a substrate comprising silicon oxide and polysilicon to selectively remove silicon oxide at an increased rate relative to polysilicon. In that regard, the method can remove silicon oxide relative to polysilicon with a selectivity of greater than about 20:1, as determined by angstroms removed per minute. In some embodiments, the method can remove silicon oxide relative to polysilicon with a selectivity of greater than about 40:1, as determined by angstroms removed per minute. In certain embodiments, the method can remove silicon oxide relative to polysilicon with a selectivity of greater than about 80:1, as determined by angstroms removed per minute.

Without wishing to be bound by any particular theory, it is believed that adding a nonionic polymer can selectively reduce the removal rate of polysilicon such that the selectivity for removal of silicon oxide relative to polysilicon is increased. In other words, the nonionic polymer can reduce the removal rate of polysilicon while having little to no impact on the removal rate of silicon oxide.

Generally, the chemical-mechanical polishing composition of the invention is stable when exposed to the polishing method, as evidenced by the abrasive particle size increase during polishing. For example, in some embodiments, the average abrasive particle size (i.e., average particle diameter) after polishing is less than 100% greater than the average abrasive particle size (i.e., average particle diameter) before polishing. In certain embodiments, the average abrasive particle size (i.e., average particle diameter) after polishing is less than 50% greater than the average abrasive particle size (i.e., average particle diameter) before polishing. In preferred embodiments, the average abrasive particle size (i.e., average particle diameter) after polishing is less than 20% greater than the average abrasive particle size (i.e., average particle diameter) before polishing.

Without wishing to be bound by any particular theory, it is believed that using a cationic monomer compound instead of a cationic polymer and/or a lower pH (e.g., about 6 to about 6.5) can result in a more stable polishing composition. As evidenced by Example 4 provided herein, a polishing composition containing a cationic polymer and a pH of 7.8 at the point of use can result in a particle size increase of greater than 400% from before polishing to after polishing.

The polishing composition of the invention desirably exhibits low particle defects when polishing a substrate, as determined by suitable techniques. In a preferred embodiment, the chemical-mechanical polishing composition of the invention comprises a wet-process ceria which contributes to the low defectivity. Particle defects on a substrate polished with the inventive polishing composition can be determined by any suitable technique. For example, laser light scattering techniques, such as dark field normal beam composite (DCN) and dark field oblique beam composite (DCO), can be used to determine particle defects on polished substrates. Suitable instrumentation for evaluating particle defectivity is available from, for example, KLA-Tencor (e.g., SURFSCAN™ SPI instruments operating at a 120 nm threshold or at 160 nm threshold).

A substrate, especially silicon comprising silicon oxide and/or polysilicon, polished with the inventive polishing composition desirably has a DCN value of about 20,000 counts or less, for example, about 17,500 counts or less, about 15,000 counts or less, about 12,500 counts or less, about 3,500 counts or less, about 3,000 counts or less, about 2,500 counts or less, about 2,000 counts or less, about 1,500 counts or less, or about 1,000 counts or less. Preferably substrates polished in accordance with an embodiment of the invention has a DCN value of about 750 counts or less, for example, about 500 counts or less, about 250 counts or less, about 125 counts or less, or even about 100 counts or less. Alternatively, or in addition, a substrate polishing with the chemical-mechanical polishing composition of the invention desirably exhibits low scratches as determined by suitable techniques. For example, silicon wafers polished in accordance with an embodiment of the invention desirably have about 250 scratches or less, or about 125 scratches or less, as determined by any suitable method known in the art.

The chemical-mechanical polishing composition and method of the invention are particularly suited for use in conjunction with a chemical-mechanical polishing apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. The polishing of the substrate takes place by the substrate being placed in contact with the polishing pad and the polishing composition of the invention, and then the polishing pad moving relative to the substrate, so as to abrade at least a portion of the substrate to polish the substrate.

A substrate can be polished with the chemical-mechanical polishing composition using any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, co-formed products thereof, and mixtures thereof. Soft polyurethane polishing pads are particularly useful in conjunction with the inventive polishing method. Typical pads include but are not limited to SURFIN™ 000, SURFIN™ SSW1, SPM3100 Eminess Technologies), POLITEX™ commercially available from Dow Chemical Company (Newark, DE), and POLYPAS™ 27 commercially available from Fujibo (Osaka, JP), and EPIC™ D100 pads or NEXPLANAR™ E6088 commercially available from Cabot Microelectronics (Aurora, IL). A preferred polishing pad is the rigid, microporous polyurethane pad (IC1010™) commercially available from Dow Chemical.

Desirably, the chemical-mechanical polishing apparatus further comprises an in situ polishing endpoint detection system, many of which are known in the art. Techniques for inspecting and monitoring the polishing process by analyzing light or other radiation reflected from a surface of the substrate being polished are known in the art. Such methods are described, for example, in U.S. Pat. Nos. 5,196,353, 5,433,651, 5,609,511, 5,643,046, 5,658,183, 5,730,642, 5,838,447, 5,872,633, 5,893,796, 5,949,927, and 5,964,643. Desirably, the inspection or monitoring of the progress of the polishing process with respect to a substrate being polished enables the determination of the polishing end-point, i.e., the determination of when to terminate the polishing process with respect to a particular substrate.

EMBODIMENTS (1) In embodiment (1) is presented a chemical-mechanical polishing composition comprising:
(a) an abrasive selected from a ceria abrasive, a zirconia abrasive, and a combination thereof;
(b) a self-stopping agent selected from a compound of formula (I):

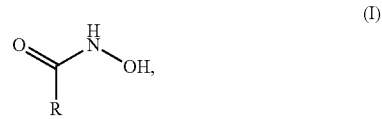

wherein R is selected from the group consisting of hydrogen, alkyl, cycloalkyl, aryl, heterocyclic alkyl, and heterocyclic aryl, each of which may be substituted or unsubstituted;
(c) a cationic monomer compound; and
(d) water,
wherein the polishing composition has a pH of about 5.5 to about 8.

(2) In embodiment (2) is presented the polishing composition of embodiment (1), wherein the polishing composition comprises about 0.001 wt. % to about 10 wt. % of the abrasive.

(3) In embodiment (3) is presented the polishing composition of embodiment (1) or embodiment (2), wherein the polishing composition comprises about 0.05 wt. % to about 5 wt. % of the abrasive.

(4) In embodiment (4) is presented the polishing composition of any one of embodiments (1)-(3), wherein the abrasive is a ceria abrasive.

(5) In embodiment (5) is presented the polishing composition of any one of embodiments (1)-(3), wherein the abrasive is a zirconia abrasive.

(6) In embodiment (6) is presented the polishing composition of any one of embodiments (1)-(5), wherein the polishing composition has a pH of about 5.5 to about 7.

(7) In embodiment (7) is presented the polishing composition of any one of embodiments (1)-(6), wherein the polishing composition has a pH of about 6 to about 6.5.

(8) In embodiment (8) is presented the polishing composition of any one of embodiments (1)-(7), wherein the self-stopping agent is selected from hydroxamic acid, acetohydroxamic acid, benzhydroxamic acid, salicylhydroxamic acid, and combinations thereof.

(9) In embodiments (9) is presented the polishing composition of any one of embodiments (1)-(8), wherein the self-stopping agent is hydroxamic acid.

(10) In embodiment (10) is presented the polishing composition of any one of embodiments (1)-(8), wherein the self-stopping agent is benzhydroxamic acid.

(11) In embodiment (11) is presented the polishing composition of any one of embodiments (1)-(8), wherein the self-stopping agent is salicylhydroxamic acid.

(12) In embodiment (12) is presented the polishing composition of any one of embodiments (1)-(11), wherein the chemical-mechanical polishing composition further comprises a nonionic polymer.

(13) In embodiment (13) is presented the polishing composition of embodiment (12), wherein the nonionic polymer is selected from polyalkylene glycols, polyetheramines, polyethylene oxide/polypropylene oxide copolymers, polyacrylamide, polyvinylpyrrolidone, siloxane polyalkyleneoxide copolymers, hydrophobically modified polyacrylate copolymers, hydrophilic nonionic polymers, polysaccharides, and combinations thereof.

(14) In embodiment (14) is presented the polishing composition of embodiment (12) or embodiment (13), wherein the nonionic polymer is polyvinylpyrrolidone.

(15) In embodiment (15) is presented the polishing composition of embodiment (12) or embodiment (13), wherein the nonionic polymer is a polyalkylene glycol.

(16) In embodiment (16) is presented the polishing composition of embodiment (12) or embodiment (13), wherein the nonionic polymer is a polyethylene oxide/polypropylene oxide copolymer.

(17) In embodiment (17) is presented the polishing composition of any one of embodiments (1)-(16), wherein the cationic monomer compound is selected from 2-(dimethylamino)ethyl acrylate ("DMAEA"), 2-(dimethylamino)ethyl methacrylate ("DMAEM"), 3-(dimethylamino)propyl methacrylamide ("DMAPMA"), 3-(dimethylamino)propyl acrylamide ("DMAPA"), 3-methacrylamidopropyl-trimethyl-ammonium chloride ("MAPTAC"), 3-acrylamidopropyl-trimethyl-ammonium chloride ("APTAC"), diallyldimethylammonium chloride ("DADMAC"), 2-(acryloyloxy)-N,N,N-trimethylethanaminium chloride ("DMAEA.MCQ"), 2-(methacryloyloxy)-N,N,N-trimethylethanaminium chloride ("DMAEM.MCQ"), N,N-dimethylaminoethyl acrylate benzyl chloride ("DMAEA.BCQ"), N,N-dimethylaminoethyl methacrylate benzyl chloride ("DMAEM.BCQ"), salts thereof, and combinations thereof.

(18) In embodiment (18) is presented the polishing composition of any one of embodiments (1)-(17), wherein the cationic monomer compound is diallyldimethylammonium chloride ("DADMAC") or a salt thereof.

(19) In embodiment (19) is presented a method of chemically-mechanically polishing a substrate comprising:
(i) providing a substrate,
(ii) providing a polishing pad,
(iii) providing a chemical-mechanical polishing composition comprising:
(a) an abrasive selected from a ceria abrasive, a zirconia abrasive, and a combination thereof
(b) a self-stopping agent selected from a compound of formula (I):

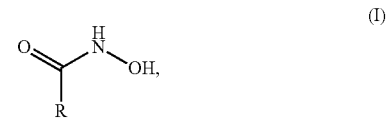

wherein R is selected from the group consisting of hydrogen, alkyl, cycloalkyl, aryl, heterocyclic alkyl, and heterocyclic aryl, each of which may be substituted or unsubstituted;
(c) a cationic monomer compound; and
(d) water,
wherein the polishing composition has a pH of about 5.5 to about 8,
(iv) contacting the substrate with the polishing pad and the chemical-mechanical polishing composition, and
(v) moving the polishing pad and the chemical-mechanical polishing composition relative to the substrate to abrade at least a portion of the substrate to polish the substrate.

(20) In embodiment (20) is presented the polishing composition of embodiment (19), wherein the polishing composition comprises about 0.001 wt. % to about 10 wt. % of the abrasive.

(21) In embodiment (21) is presented the polishing composition of embodiment (19) or embodiment (20), wherein the polishing composition comprises about 0.05 wt. % to about 5 wt. % of the abrasive.

(22) In embodiment (22) is presented the polishing composition of any one of embodiments (19)-(21), wherein the abrasive is a ceria abrasive.

(23) In embodiment (23) is presented the polishing composition of any one of embodiments (19)-(21), wherein the abrasive is a zirconia abrasive.

(24) In embodiment (24) is presented the polishing composition of any one of embodiments (19)-(23), wherein the polishing composition has a pH of about 5.5 to about 7.

(25) In embodiment (25) is presented the polishing composition of any one of embodiments (19)-(24), wherein the polishing composition has a pH of about 6 to about 6.5.

(26) In embodiment (26) is presented the polishing composition of any one of embodiments (19)-(25), wherein the self-stopping agent is selected from hydroxamic acid, acetohydroxamic acid, benzhydroxamic acid, salicylhydroxamic acid, and combinations thereof.

(27) In embodiment (27) is presented the polishing composition of any one of embodiments (19)-(26), wherein the self-stopping agent is hydroxamic acid.

(28) In embodiment (28) is presented the polishing composition of any one of embodiments (19)-(26), wherein the self-stopping agent is benzhydroxamic acid.

(29) In embodiment (29) is presented the polishing composition of any one of embodiments (19)-(26), wherein the self-stopping agent is salicylhydroxamic acid.

(30) In embodiment (30) is presented the polishing composition of any one of embodiments (19)-(29), wherein the chemical-mechanical polishing composition further comprises a nonionic polymer.

(31) In embodiment (31) is presented the method of embodiment (30), wherein the nonionic polymer is selected from polyalkylene glycols, polyetheramines, polyethylene oxide/polypropylene oxide copolymers, polyacrylamide, polyvinylpyrrolidone, siloxane polyalkyleneoxide copolymers, hydrophobically modified polyacrylate copolymers, hydrophilic nonionic polymers, polysaccharides, and combinations thereof.

(32) In embodiment (32) is presented the method of embodiment (30) or embodiment (31), wherein the nonionic polymer is polyvinylpyrrolidone.

(33) In embodiment (33) is presented the method of embodiment (30) or embodiment (31), wherein the nonionic polymer is a polyalkylene glycol.

(34) In embodiment (34) is presented the method of embodiment (30) or embodiment (31), wherein the nonionic polymer is a polyethylene oxide/polypropylene oxide copolymer.

(35) In embodiment (35) is presented the method of any one of embodiments (19)-(34), wherein the cationic monomer compound is selected from 2-(dimethylamino)ethyl acrylate ("DMAEA"), 2-(dimethylamino)ethyl methacrylate ("DMAEM"), 3-(dimethylamino)propyl methacrylamide ("DMAPMA"), 3-(dimethylamino)propyl acrylamide ("DMAPA"), 3-methacrylamidopropyl-trimethyl-ammonium chloride ("MAPTAC"), 3-acrylamidopropyl-trimethyl-ammonium chloride ("APTAC"), diallyldimethylammonium chloride ("DADMAC"), 2-(acryloyloxy)-N,N,N-trimethylethanaminium chloride ("DMAEA.MCQ"), 2-(methacryloyloxy)-N,N,N-trimethylethanaminium chloride ("DMAEM.MCQ"), N,N-dimethylaminoethyl acrylate benzyl chloride ("DMAEA.BCQ"), N,N-dimethylaminoethyl methacrylate benzyl chloride ("DMAEM.BCQ"), salts thereof, and combinations thereof.

(36) In embodiment (36) is presented the method of any one of embodiments (19)-(35), wherein the cationic monomer compound is diallyldimethylammonium chloride ("DADMAC") or a salt thereof.

(37) In embodiment (37) is presented the method of any one of embodiments (19)-(36), wherein the substrate comprises silicon oxide, and wherein at least a portion of the silicon oxide is abraded to polish the substrate.

(38) In embodiment (38) is presented the method of embodiment (37), wherein the substrate further comprises polysilicon, and wherein at least a portion of the polysilicon is abraded to polish the substrate.

(39) In embodiment (39) is presented the method of embodiment (38), wherein polishing the substrate removes silicon oxide relative to polysilicon with a selectivity of greater than about 20:1, as determined by angstroms removed per minute.

(40) In embodiment (40) is presented the method of embodiment (39), wherein polishing the substrate removes silicon oxide relative to polysilicon with a selectivity of greater than about 40:1, as determined by angstroms removed per minute.

EXAMPLES

These following examples further illustrate the invention but, of course, should not be construed as in any way limiting its scope.

The following abbreviations are used throughout the Examples: removal rate (RR); tetraethyl orthosilicate (TEOS); and polysilicon (polySi); polyethylene glycol (PEG); point of use (POU); and weight average molecular weight (MW).

In the following examples, substrates TEOS (i.e., silicon oxide) and/or polySi were coated on patterned wafers, and were polished using either a MIRRA™ (Applied Materials, Inc.) polishing tool, an AP-300™ (CTS Co., Ltd) polishing tool, or a REFLEXION™ (Applied Materials, Inc.) polishing tool. An IC 1010™ polishing pad (Rohm and Haas Electronic Materials) or a NEXPLANAR™ E6088 polishing pad (Cabot Microelectronics, Aurora, IL) were used with identical polishing parameters for all compositions. Unless stated otherwise, standard REFLEXION™ polishing parameters are as follows: IC1010™ pad, downforce=20.68 kPa (3 psi), headspeed=110 rpm, platen speed=120 rpm, total flow rate=200 mL/min. Unless stated otherwise, standard AP300™ polishing parameters are as follows: IC1010™ pad, downforce=20.68 kPa (3 psi), headspeed=110 rpm, platen speed=120 rpm, total flow rate=200 mL/min. Unless stated otherwise, standard MIRRA™ polishing parameters are as follows: IC1010™ pad, downforce=20.68 kPa (3 psi), headspeed=110 rpm, platen speed=120 rpm, total flow rate=200 mL/min or NEXPLANAR™ E6088 pad downforce=20.68 kPa (3 psi), headspeed=110 rpm, platen speed=120 rpm, total flow rate=200 mL/min. Removal rates were calculated by measuring the film thickness, using spectroscopic elipsometry, and subtracting the final thickness from the initial thickness.

Example 1

This example demonstrates the preparation of polishing compositions containing (a) a ceria abrasive, a zirconia abrasive, or a combination thereof, (b) a self-stopping agent, (c) optionally a nonionic polymer, and (d) a cationic monomer compound according to the invention. Abrasive formulations A1 and A2 and additive formulations B1-B13 were used in preparation of the polishing compositions used in Examples 2-4, below, to demonstrate the efficiency of the claimed polishing methods.

For each of the polishing compositions used in Examples 2-4, abrasive formulations A1 and A2 were prepared using Hybrid-30 ceria particles (commercially available from ANP Co., Ltd.) or zirconium oxide (commercially available from Saint Gobain) in combination with picolinic acid (500 ppm). The pH of the resulting mixture was adjusted to 4.2. The abrasive formulations are summarized in Table 1.

TABLE 1

| Abrasive Formulations | | | |
| --- | --- | --- | --- |
| Abrasive Formulation | Ceria or Zirconia (wt. %) | Picolinic Acid (ppm) | pH |
| A1 | Hybrid-30 (0.29) | 500 | 4.2 |
| A2 | Zirconium oxide (0.30) | 500 | 4.2 |

For each of the polishing compositions used in Examples 2-4, additive formulations B1-B13 were prepared using diallyldimethylammonium chloride ("DADMAC") or poly (2-methacryloyloxyethyltrimethylammonium chloride) ("polyMADQUAT") as a cationic additive, benzhydroxamic acid or salicylhydroxamic acid as the self-stopping agent, and polyvinylpyrrolidone ("PVP"), Brij™ S20 (commercially available from Sigma Aldrich), or Pluronic L31 (commercially available from Sigma Aldrich) as the nonionic polymer. The additive formulations optionally further comprised Bis-Tris™ (commercially available from Sigma Aldrich) as buffer, and the pH was adjusted with nitric acid or triethanolamine ("TEA"). The additive formulations are summarized in Table 2.

polymer, and (d) a cationic monomer compound according to the invention.

Separate patterned wafers (200×300 mm wafers) containing 250 μm TEOS features with a 50% pattern density (approximately 20,000 Å thick features) were coated on patterned silicon substrates having a step-height of approximately 8,000 Å, and were polished on Mirra™ or Reflexion™ tools using an IC1010™ pad with Comparative Polishing Compositions 2A-2D and Inventive Polishing Compositions 2E-2J. Comparative Polishing Compositions 2A-2D and Inventive Polishing Compositions 2E-2J were prepared by combining 7:3 volumes of an abrasive formulation and an additive formulation. The active removal rate (Active RR) and blanket removal rate (Blanket RR) were measured and the results are set forth in Table 3.

Comparative Polishing Compositions 2A-2D differed from Inventive Polishing Compositions 2E-2J because Inventive Polishing Compositions 2E-2J contained a cationic monomer compound.

TABLE 2

Additive Formulations

| Additive Formulation | Cationic additive (ppm) | Self-stopping agent (ppm) | Nonionic Polymer (ppm) | Buffer (ppm) | Base/Acid | pH |
|---|---|---|---|---|---|---|
| B1 | DADMAC (120) | BHA (1670) | — | Bis-Tris (4000) | Nitric acid | 7 |
| B2 | DADMAC (120) | BHA (1670) | PVP MW 5000 (330) | Bis-Tris (4000) | Nitric acid | 7 |
| B3 | DADMAC (120) | BHA (1670) | PVP MW 5000 (990) | Bis-Tris (4000) | Nitric acid | 7 |
| B4 | DADMAC (120) | BHA (1670) | PVP MW 5000 (1650) | Bis-Tris (4000) | Nitric acid | 7 |
| B5 | DADMAC (120) | BHA (1670) | PVP MW 9000 (330) | Bis-Tris (4000) | Nitric acid | 7 |
| B6 | DADMAC (120) | BHA (1670) | PVP MW 9000 (990) | Bis-Tris (4000) | Nitric acid | 7 |
| B7 | DADMAC (120) | BHA (1670) | Brij S20 (330) | Bis-Tris (4000) | Nitric acid | 7 |
| B8 | DADMAC (120) | BHA (1670) | Brij S20 (990) | Bis-Tris (4000) | Nitric acid | 7 |
| B9 | DADMAC (120) | BHA (1670) | Pluronic L31 (330) | Bis-Tris (4000) | Nitric acid | 7 |
| B10 | DADMAC (120) | BHA (1670) | Pluronic L31 (990) | Bis-Tris (4000) | Nitric acid | 7 |
| B11 | polyMADQUAT (120 ppm) | BHA (1670) | — | Bis-Tris (4000) | Nitric acid | 7 |
| B12 | polyMADQUAT (250 ppm) | BHA (1670) BTA (1200) | — | — | TEA | 8.2 |
| B13 | polyMADQUAT (200 ppm) | SHA (1670) BTA (1200) | — | — | TEA | 7.5 |

Example 2

This example demonstrates the beneficial topographical selectivity provided by a polishing composition containing (a) a ceria abrasive, a zirconia abrasive, or a combination thereof, (b) a self-stopping agent, (c) optionally a nonionic

TABLE 3

Polishing Removal Rates and Topographical Selectivity

| Polishing Composition | Additive Formulation | Abrasive Formulation | pH (POU) | Active RR (Å/min) | Blanket RR (Å/min) | Selectivity (Active/Blanket) |
|---|---|---|---|---|---|---|
| Polishing Composition 2A (Comparative) | Hydroxamic Acid | A1 | 4.2 | 11784 | 8266 | 1 |
| Polishing Composition 2B (Comparative) | B11 | A1 | 6.2 | 8478 | 122 | 69 |

TABLE 3-continued

Polishing Removal Rates and Topographical Selectivity

| Polishing Composition | Additive Formulation | Abrasive Formulation | pH (POU) | Active RR (Å/min) | Blanket RR (Å/min) | Selectivity (Active/Blanket) |
|---|---|---|---|---|---|---|
| Polishing Composition 2C (Comparative) | B12 | A1 | 7.7 | 12173 | 403 | 30 |
| Polishing Composition 2D (Comparative) | B13 | A1 | 6.2 | 777 | 90 | 8 |
| Polishing Composition 2E (Inventive) | B1 | A1 | 6.2 | 11560 | 120 | 96 |
| Polishing Composition 2F (Inventive) | B2 | A1 | 6.2 | 12500 | 550 | 23 |
| Polishing Composition 2G (Inventive) | B3 | A1 | 6.2 | 12300 | 380 | 32 |
| Polishing Composition 2H (Inventive) | B4 | A1 | 6.2 | 10272 | 320 | 32 |
| Polishing Composition 2I (Inventive) | B5 | A1 | 6.2 | 11900 | 500 | 23 |
| Polishing Composition 2J (Inventive) | B6 | A1 | 6.2 | 8643 | 200 | 43 |

As is apparent from Table 3, Comparative Polishing Composition 2A, containing a ceria abrasive, a self-stopping agent (hydroxamic acid), and a pH of 4.2, exhibited a low active RR:blanket RR ratio. In other words, Comparative Polishing Composition 2A, not containing a cationic monomer compound, exhibited limited selectivity between active removal rate and blanket removal rate.

Table 3 also shows that Comparative Polishing Compositions 2B-2D, containing a ceria abrasive, a self-stopping agent, and a cationic polymer, exhibited an improved active RR:blanket RR ratio relative to Comparative Polishing Composition 2A. However, the active removal rate decreased significantly (see Comparative Polishing Compositions 2B and 2D) if the pH was not increased to 7.7, as evidenced by Comparative Polishing Composition 2C.

In contrast, Inventive Polishing Compositions 2E-2J, containing a ceria abrasive, a self-stopping agent, and a cationic monomer compound, exhibited high active removal rates and high topological selectivities at a pH as low as 6.2. These results demonstrate the improved topographical selectivity exhibited by Inventive Polishing Compositions 2E-2J relative to Comparative Polishing Compositions 2A-2D.

Example 3

This example demonstrates the effect on selectivity exhibited by a polishing composition of the invention containing a nonionic polymer.

Patterned substrates comprising TEOS and polySi were polished on Mirra™ or Reflexion™ tools using an IC1010™ pad with Comparative Polishing Compositions 3A and 3B, and Inventive Polishing Compositions 3C-3K. Comparative Polishing Compositions 3A and 3B, and Inventive Polishing Compositions 3C-3K were prepared by combining 7:3 volumes of an abrasive formulation and an additive formulation. The active removal rate (TEOS) and polySi removal rate were measured and the results are set forth in Table 4.

Comparative Polishing Compositions 3A and 3B, and Inventive Polishing Composition 3C differed from Inventive Polishing Compositions 3D-3K because Inventive Polishing Compositions 3D-3K contained a nonionic polymer.

TABLE 4

Polishing Removal Rates and Selectivity

| Polishing Composition | Additive Formulation | Abrasive Formulation | pH (POU) | Active RR (Å/min) | PolySi RR (Å/min) | Selectivity (Active/PolySi) |
|---|---|---|---|---|---|---|
| Polishing Composition 3A (Comparative) | B11 | A1 | 6.2 | 8480 | 1065 | 8 |
| Polishing Composition 3B (Comparative) | B12 | A1 | 7.7 | 12173 | 2420 | 5 |
| Polishing Composition 3C (Inventive) | B1 | A1 | 6.2 | 11560 | 1060 | 11 |
| Polishing Composition 3D (Inventive) | B2 | A1 | 6.2 | 12500 | 145 | 86 |

TABLE 4-continued

Polishing Removal Rates and Selectivity

| Polishing Composition | Additive Formulation | Abrasive Formulation | pH (POU) | Active RR (Å/min) | PolySi RR (Å/min) | Selectivity (Active/PolySi) |
|---|---|---|---|---|---|---|
| Polishing Composition 3E (Inventive) | B3 | A1 | 6.2 | 12300 | 39 | 315 |
| Polishing Composition 3F (Inventive) | B4 | A1 | 6.2 | 11800 | 32 | 371 |
| Polishing Composition 3G (Inventive) | B6 | A1 | 6.2 | 11925 | 20 | 596 |
| Polishing Composition 3H (Inventive) | B7 | A1 | 6.2 | — | 75 | — |
| Polishing Composition 3I (Inventive) | B8 | A2 | 6.2 | — | 54 | — |
| Polishing Composition 3J (Inventive) | B9 | A2 | 6.2 | — | 95 | — |
| Polishing Composition 3K (Inventive) | B10 | A2 | 6.2 | — | 95 | — |

As is apparent from Table 4, inventive Polishing Compositions 3C-3K, containing (a) a ceria abrasive or a zirconia abrasive, (b) a self-stopping agent and (c) a cationic monomer compound, exhibited higher active removal rates (i.e., TEOS removal rates) relative to comparative Polishing Composition 3A, containing a ceria abrasive, a self-stopping agent, and a cationic polymer, at the same pH (i.e., a pH of 6.2). Inventive Polishing Compositions 3H-3K were so efficient that the active removal rates (i.e., TEOS removal rates) were not measured.

Table 4 also shows that adding a nonionic polymer, such as polyvinylpyrrolidone ("PVP"), Brij™ S20 (commercially available from Sigma Aldrich), or Pluronic™ L31 (commercially available from Sigma Aldrich), reduced the PolySi removal rate significantly without impacting the active removal rate (i.e., TEOS removal rate), as evidenced by Inventive Polishing Compositions 3D-3K as compared to Comparative Polishing Compositions 3A and 3B or Inventive Polishing Composition 3C. These results demonstrate that polishing compositions according to the invention have a high active removal rate (i.e., TEOS removal rate), and can be made selective for polishing TEOS over PolySi by addition of a nonionic polymer without significantly reducing the TEOS removal rate.

Example 4

This example demonstrates the effect on stability exhibited by a polishing composition of the invention containing a cationic monomer compound as opposed to a cationic polymer.

Patterned substrates comprising TEOS and polySi were polished on Mirra™ or Reflexion™ tools using an IC1010™ pad with Comparative Polishing Composition 4A and Inventive Polishing Compositions 4B and 4C. Comparative Polishing Compositions 4A and Inventive Polishing Compositions 4B and 4C were prepared by combining 7:3 volumes of an abrasive formulation and an additive formulation. The abrasive particle size before polishing and abrasive particle size after polishing were measured and the results are set forth in Table 5.

Comparative Polishing Composition 4A differed from Inventive Polishing Compositions 4B and 4C because Inventive Polishing Compositions 4B and 4C contained a cationic monomer compound instead of a cationic polymer and had a lower pH. Each polishing composition was used for 60 seconds of polishing.

TABLE 5

Particle Size After Polishing

| Polishing Composition | Additive Formulation | Abrasive Formulation | pH (POU) | Particle Size Before (nm) | Particle Size After (nm) |
|---|---|---|---|---|---|
| Polishing Composition 4A (Comparative) | B12 | A1 | 7.8 | 102 | 472 |
| Polishing Composition 4B (Inventive) | B3 | A1 | 6.2 | 100 | 101 |
| Polishing Composition 4C (Inventive) | B1 | A1 | 6.2 | 100 | 114 |

As is apparent from Table 5, inventive Polishing Compositions 4B and 4C, containing diallyldimethylammonium chloride ("DADMAC") as the cationic monomer compound and a pH of 6.2, maintained the same particle size before and after polishing. In contrast, comparative Polishing Composition 4A, containing poly(2-methacryloyloxyethyltrimethylammonium chloride) ("polyMADQUAT") and a pH of 7.8, exhibited greater than a 4-fold increase in particle size after polishing. These results demonstrate that polishing compositions containing a cationic monomer compound and a lower pH (e.g., about 5.5 to about 7) are more stable than polishing compositions containing a cationic polymer and a higher pH (e.g., about 7.5 and above).

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
(a) an abrasive selected from a ceria abrasive, a zirconia abrasive, and a combination thereof;
(b) a self-stopping agent selected from a compound of formula (I):

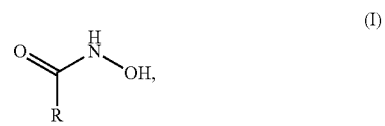

wherein R is selected from the group consisting of hydrogen, alkyl, cycloalkyl, aryl, heterocyclic alkyl, and heterocyclic aryl, each of which may be substituted or unsubstituted;
(c) a cationic monomer; and
(d) water,
wherein the polishing composition has a pH of about 5.5 to about 8.

2. The polishing composition of claim 1, wherein the polishing composition comprises about 0.001 wt. % to about 10 wt. % of the abrasive.

3. The polishing composition of claim 1, wherein the polishing composition comprises about 0.05 wt. % to about 5 wt. % of the abrasive.

4. The polishing composition of claim 1, wherein the abrasive is a ceria abrasive.

5. The polishing composition of claim 1, wherein the polishing composition has a pH of about 5.5 to about 7.

6. The polishing composition of claim 5, wherein the polishing composition has a pH of about 6 to about 6.5.

7. The polishing composition of claim 1, wherein the self-stopping agent is selected from hydroxamic acid, acetohydroxamic acid, benzhydroxamic acid, salicylhydroxamic acid, and combinations thereof.

8. The polishing composition of claim 7, wherein the self-stopping agent is benzhydroxamic acid.

9. The polishing composition of claim 1, wherein the chemical-mechanical polishing composition further comprises a nonionic polymer.

10. The polishing composition of claim 9, wherein the nonionic polymer is selected from polyalkylene glycols, polyetheramines, polyethylene oxide/polypropylene oxide copolymers, polyacrylamide, polyvinylpyrrolidone, siloxane polyalkyleneoxide copolymers, hydrophobically modified polyacrylate copolymers, hydrophilic nonionic polymers, polysaccharides, and combinations thereof.

11. The polishing composition of claim 10, wherein the nonionic polymer is a polyethylene oxide/polypropylene oxide copolymer.

12. The polishing composition of claim 1, wherein the cationic monomer is selected from 2-(dimethylamino)ethyl acrylate ("DMAEA"), 2-(dimethylamino)ethyl methacrylate ("DMAEM"), 3-(dimethylamino)propyl methacrylamide ("DMAPMA"), 3-(dimethylamino)propyl acrylamide ("DMAPA"), 3-methacrylamidopropyl-trimethyl-ammonium chloride ("MAPTAC"), 3-acrylamidopropyl-trimethyl-ammonium chloride ("APTAC"), diallyldimethylammonium chloride ("DADMAC"), 2-(acryloyloxy)-N,N,N-trimethylethanaminium chloride ("DMAEA.MCQ"), 2-(methacryloyloxy)-N,N,N-trimethylethanaminium chloride ("DMAEM.MCQ"), N,N-dimethylaminoethyl acrylate benzyl chloride ("DMAEA.BCQ"), N,N-dimethylaminoethyl methacrylate benzyl chloride ("DMAEM.BCQ"), salts thereof, and combinations thereof.

13. The polishing composition of claim 12, wherein the cationic monomer is diallyldimethylammonium chloride ("DADMAC") or a salt thereof.

14. A method of chemically-mechanically polishing a substrate comprising:
(i) providing a substrate,
(ii) providing a polishing pad, (iii) providing a chemical-mechanical polishing composition comprising:
 (a) an abrasive selected from a ceria abrasive, a zirconia abrasive, and a combination thereof;
 (b) a self-stopping agent selected from a compound of formula (I):

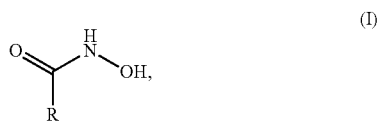

wherein R is selected from the group consisting of hydrogen, alkyl, cycloalkyl, aryl, heterocyclic alkyl, and heterocyclic aryl, each of which may be substituted or unsubstituted;
 (c) a cationic monomer; and
 (d) water,
wherein the polishing composition has a pH of about 5.5 to about 8,
(iv) contacting the substrate with the polishing pad and the chemical-mechanical polishing composition, and
(v) moving the polishing pad and the chemical-mechanical polishing composition relative to the substrate to abrade at least a portion of the substrate to polish the substrate.

15. The method of claim 14, wherein the polishing composition comprises about 0.001 wt. % to about 10 wt. % of the abrasive.

16. The method of claim 15, wherein the polishing composition comprises about 0.05 wt. % to about 5 wt. % of the abrasive.

17. The method of claim 14, wherein the abrasive is a ceria abrasive.

18. The method of claim 14, wherein the polishing composition has a pH of about 5.5 to about 7.

19. The method of claim 18, wherein the polishing composition has a pH of about 6 to about 6.5.

20. The method of claim 14, wherein the self-stopping agent is selected from hydroxamic acid, acetohydroxamic acid, benzhydroxamic acid, salicylhydroxamic acid, and combinations thereof.

21. The method of claim 20, wherein the self-stopping agent is benzhydroxamic acid.

22. The method of claim 14, wherein the chemical-mechanical polishing composition further comprises a nonionic polymer.

23. The method of claim 22, wherein the nonionic polymer is selected from polyalkylene glycols, polyetheramines, polyethylene oxide/polypropylene oxide copolymers, polyacrylamide, polyvinylpyrrolidone, siloxane polyalkyleneoxide copolymers, hydrophobically modified polyacrylate copolymers, hydrophilic nonionic polymers, polysaccharides, and combinations thereof.

24. The method of claim 14, wherein the cationic monomer is selected from 2-(dimethylamino)ethyl acrylate ("DMAEA"), 2-(dimethylamino)ethyl methacrylate ("DMAEM"), 3-(dimethylamino)propyl methacrylamide ("DMAPMA"), 3-(dimethylamino)propyl acrylamide ("DMAPA"), 3-methacrylamidopropyl-trimethyl-ammonium chloride ("MAPTAC"), 3-acrylamidopropyl-trimethyl-ammonium chloride ("APTAC"), diallyldimethylammonium chloride ("DADMAC"), 2-(acryloyloxy)-N,N,N-trimethylethanaminium chloride ("DMAEA.MCQ"), 2-(methacryloyloxy)-N,N,N-trimethylethanaminium chloride ("DMAEM.MCQ"), N,N-dimethylaminoethyl acrylate benzyl chloride ("DMAEA.BCQ"), N,N-dimethylaminoethyl methacrylate benzyl chloride ("DMAEM.BCQ"), salts thereof, and combinations thereof.

25. The method of claim 24, wherein the cationic monomer is diallyldimethylammonium chloride ("DADMAC") or a salt thereof.

* * * * *